United States Patent
Li et al.

(10) Patent No.: US 10,868,238 B2
(45) Date of Patent: Dec. 15, 2020

(54) MAGNETIC TUNNEL JUNCTION INTEGRATION WITHOUT PATTERNING PROCESS

(71) Applicant: QUALCOMM Incorporated, San Diego, CA (US)

(72) Inventors: Xia Li, San Diego, CA (US); Wei-Chuan Chen, San Diego, CA (US); Seung Hyuk Kang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 108 days.

(21) Appl. No.: 16/159,876

(22) Filed: Oct. 15, 2018

(65) Prior Publication Data
US 2020/0119262 A1    Apr. 16, 2020

(51) Int. Cl.
| H01L 43/12 | (2006.01) |
| H01L 43/10 | (2006.01) |
| H01L 27/22 | (2006.01) |
| H01L 43/02 | (2006.01) |
| H01L 43/08 | (2006.01) |

(52) U.S. Cl.
CPC .......... *H01L 43/12* (2013.01); *H01L 27/222* (2013.01); *H01L 43/02* (2013.01); *H01L 43/08* (2013.01); *H01L 43/10* (2013.01)

(58) Field of Classification Search
CPC ...... H01L 27/222; H01L 27/224; H01L 43/12
See application file for complete search history.

(56) References Cited

U.S. PATENT DOCUMENTS

| 2003/0224608 A1* | 12/2003 | Lee | H01L 21/0331 |
| | | | 438/694 |
| 2004/0063305 A1* | 4/2004 | Kloster | H01L 21/7682 |
| | | | 438/619 |
| 2004/0248409 A1* | 12/2004 | Padhi | H01L 21/288 |
| | | | 438/653 |
| 2010/0012989 A1* | 1/2010 | Lee | H01L 21/31111 |
| | | | 257/288 |
| 2015/0069561 A1* | 3/2015 | Tan | H01L 43/12 |
| | | | 257/421 |

OTHER PUBLICATIONS

Nguyen V.D., et al., "Novel approach for nano-patterning magnetic tunnel junctions stacks at narrow pitch: A route towards high density STT-MRAM applications," International Electron Devices Meeting (IEDM), IEEE, 2017, pp. 38.5.1-38.5.4.

* cited by examiner

*Primary Examiner* — Cuong Q Nguyen
*Assistant Examiner* — Peter M Albrecht
(74) *Attorney, Agent, or Firm* — Patterson & Sheridan, L.L.P.

(57) ABSTRACT

Certain aspects of the present disclosure provide techniques for fabricating an integrated circuit with a magnetic tunnel junction (MTJ) without a patterning process for the MTJ. An example method generally includes depositing a first diffusion barrier layer above an oxide layer having a conductive pillar therein, forming a first trench in the first diffusion barrier layer above the conductive pillar, depositing a first electrode in the first trench such that the first electrode is coupled to the conductive pillar, removing the oxide layer and the first diffusion barrier layer to expose the conductive pillar and the first electrode, and depositing an MTJ above the first electrode according to a shape of the first electrode.

18 Claims, 6 Drawing Sheets

MAGNETIC TUNNEL JUNCTION INTEGRATION WITHOUT PATTERNING PROCESS

BACKGROUND

Field of the Disclosure

Aspects of the present disclosure relate to integrated circuits, and more particularly, to techniques for fabricating an integrated circuit with a magnetic tunnel junction (MTJ) without a patterning process for the MTJ.

Description of Related Art

Integrated circuits often incorporate the use of read-only memory (ROM) or random access memory (RAM) for storing information used during the operation and/or testing of the integrated circuit. Examples of the type of information commonly stored in this manner include device revision numbers that indicate the design revision used during fabrication of the integrated circuit and signature codes that are the results produced when a standard testing operation is performed on a properly operating sample of the integrated circuit.

RAM is a ubiquitous component of modern digital architectures. RAM can be standalone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Magnetoresistive random access memory (MRAM) is a non-volatile memory technology that has response (read/write) times comparable to volatile memory. In contrast to conventional RAM technologies which store data as electric charges or current flows, MRAM uses magnetic elements. A magnetic tunnel junction (MTJ) storage element can be formed from two magnetic layers, each of which can hold a magnetic field, separated by an insulating (tunnel barrier) layer. One of the two layers (e.g., fixed layer), is set to a particular polarity. The other layer's (e.g., free layer) polarity is free to change to match that of an external field that can be applied. A change in the polarity of the free layer will change the resistance of the MTJ storage element. For example, when the polarities are aligned, a low resistance state exists. When the polarities are not aligned, a high resistance state exists. Those skilled in the art will appreciate that each layer may comprise one or more layers of materials, as is known in the art.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include improved magnetic tunnel junction (MTJ) integration with circuits, such as RAM or ROM.

Certain aspects provide a method of fabricating an integrated circuit. The method generally includes depositing a first diffusion barrier layer above an oxide layer having a conductive pillar therein, forming a first trench in the first diffusion barrier layer above the conductive pillar, depositing a first electrode in the first trench such that the first electrode is coupled to the conductive pillar, removing the oxide layer and the first diffusion barrier layer to expose the conductive pillar and the first electrode, and depositing an MTJ above the first electrode according to a shape of the first electrode.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Aspects of the present disclosure provide a method of fabricating an integrated circuit with at least one magnetic tunnel junction (MTJ) without a patterning process for the MTJ.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Example Magnetic Tunnel Junction Integration

For certain fabrication techniques, an MTJ array may be integrated in a circuit via expensive photolithography and etching processes, which may use a thick hard mask (e.g., >70 nm) for MTJ etch consumption. The thick hardmask results in the MTJ and hardmask stack having a thickness greater than 100 nm, which poses difficulties in fitting such MTJ and hardmask stacks into advanced via stacks of integrated circuits, which may have a height limit less than 100 nm. Certain photolithography and etching processes may be relatively expensive and may also result in a high aspect ratio (e.g., >3) for the MTJ stack. Furthermore, the etching sidewall angle of 80 degrees for such processes limits the minimum spacing available for MTJ nodes (e.g., >20 nm). The limits on minimum spacing make it difficult to reduce the pitch and increase the density of the MTJ array.

Aspects of the present disclosure provide a method of fabricating an integrated circuit that integrates the MTJ stacks without an expensive photolithography and etching patterning process. An example method described herein may provide an MTJ stack thickness less than or equal to 40 nm, a pitch less than 50 nm between the MTJ and other MTJs in the integrated circuit, and a diameter of the MTJ less than or equal to 35 nm (or scaling factor of F=1.5). In general, the example method enables improved miniaturization of MTJs, increasing the density of the MTJ array.

Figure 1:
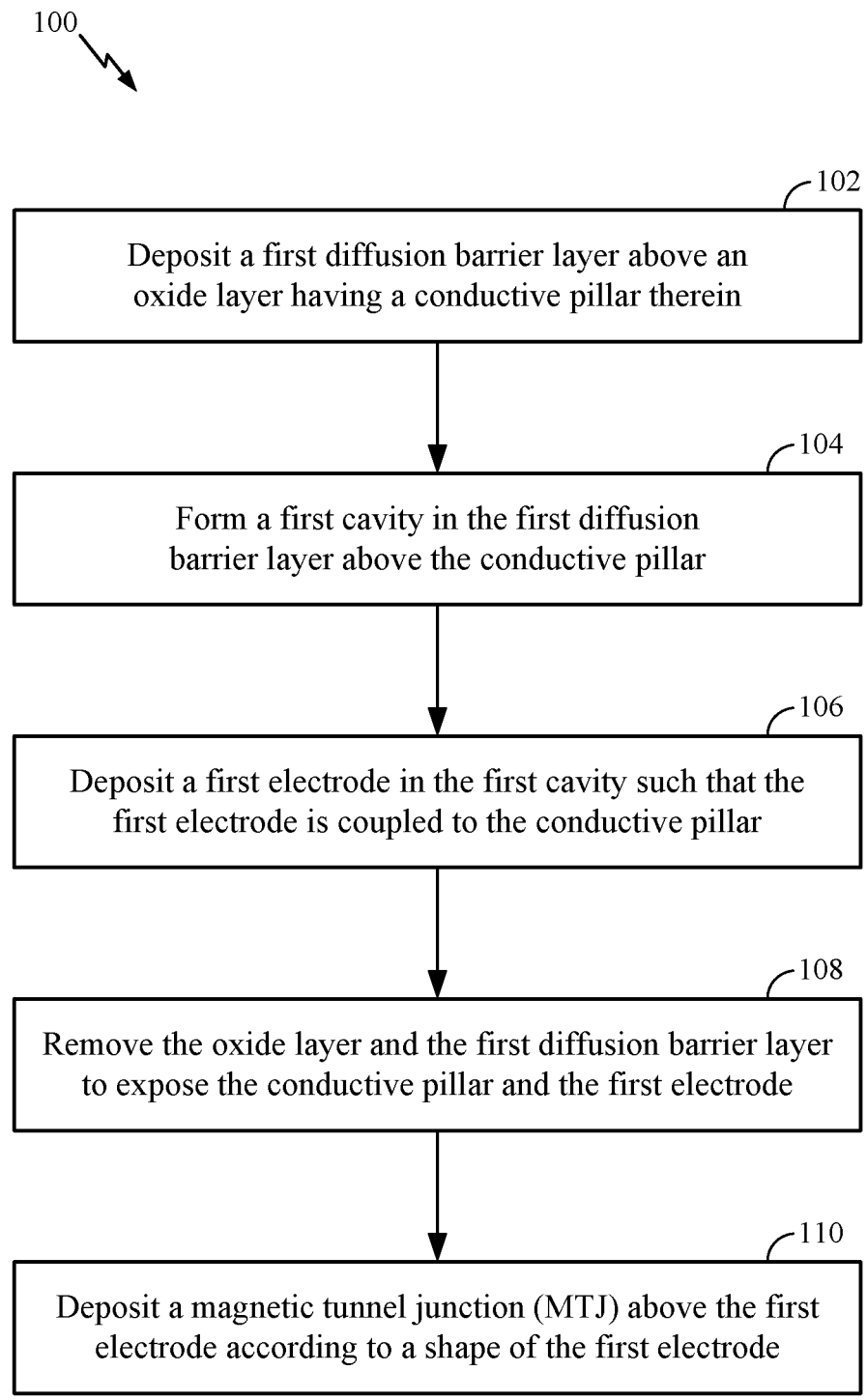
FIG. 1 is a flow diagram of example operations for fabricating an integrated circuit with an MTJ, in accordance with certain aspects of the present disclosure.

FIG. 1 is a flow diagram of example operations 100 for fabricating an integrated circuit (IC) with an MTJ array, in accordance with certain aspects of the present disclosure.

The operations 100 may be performed, for example, by a semiconductor processing chamber. The operations 100 may begin, at block 102, where a first diffusion barrier layer is deposited above an oxide layer having a conductive pillar therein. At block 104, a first trench is formed in the first diffusion barrier layer above the conductive pillar. At block 106, a first electrode is deposited in the first trench such that the first electrode is coupled to the conductive pillar. At block 108, the oxide layer and the first diffusion barrier layer are removed to expose the conductive pillar and the first electrode. At block 110, an MTJ is deposited above the first electrode according to a shape of the first electrode.

FIGS. 2A-2I are cross-sectional views showing example operations for forming the MTJ array of an example integrated circuit, in accordance with certain aspects of the present disclosure. As an example, the integrated circuit may be a memory device, such as a magnetoresistive random access memory (MRAM). As another example, the integrated circuit may have a ROM or RAM, implemented with the MTJ array fabricated as described herein.

Figure 2A:
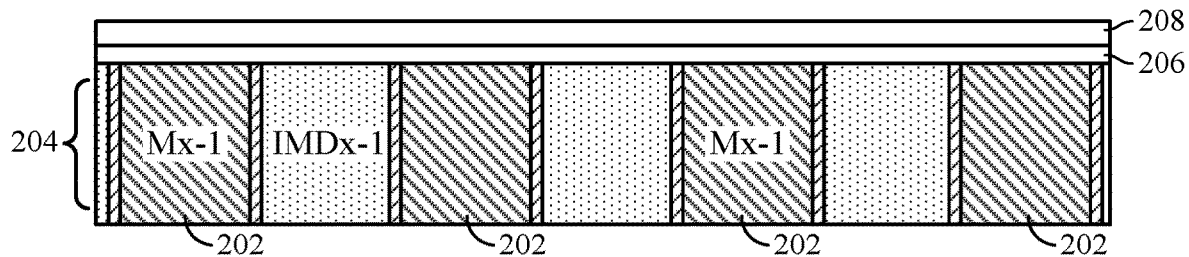
FIG. 2A illustrates a cross-sectional view of an example dielectric layer, in accordance with certain aspects of the present disclosure.

Referring to FIG. 2A, conductive traces 202 may be formed in a first layer 204, such as an oxide layer or dielectric layer. The first layer 204 (labeled "IMDx-1") may be an inter-metal dielectric (IMD) layer with conductive traces or vias embedded therein. The conductive traces 202 (labeled "Mx-1" for metal layer x-1) may electrically couple the MTJ array to other electronic devices (e.g., resistors, capacitors, transistors, etc.). A first diffusion barrier layer 206 (e.g., a diffusion barrier material comprising SiCN) may be deposited above the first layer 204, and a dummy layer 208 (e.g., an amorphous carbon film, a photoresist layer, or an oxide layer) may be formed above the first layer 204. The dummy layer 208 may be a temporary layer used to remove portions of an MTJ film deposited on the dummy layer 208 as further described herein.

Figure 2B:
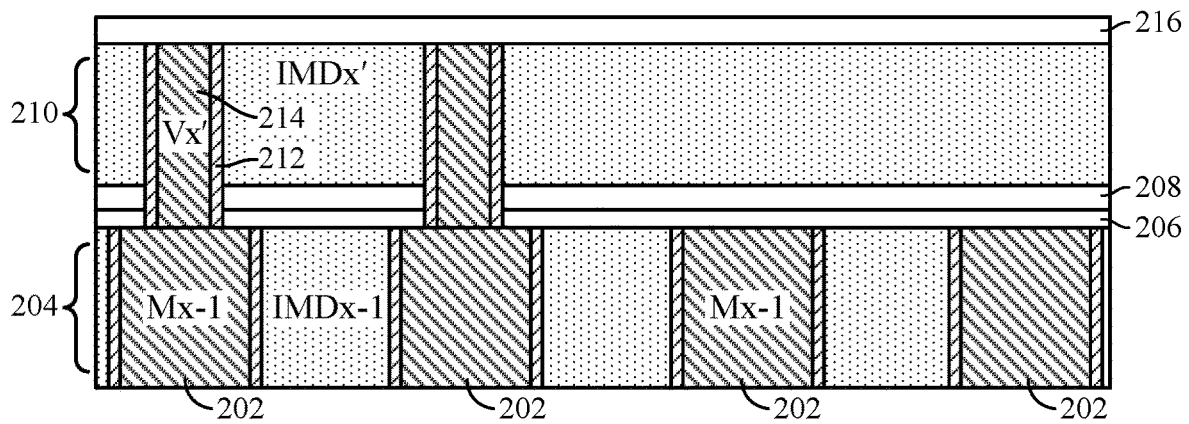
FIG. 2B illustrates a cross-sectional view of the example dielectric layer with an oxide layer disposed thereon, in accordance with certain aspects of the present disclosure.

Referring to FIG. 2B, an oxide layer 210 may be formed above the dummy layer 208. The oxide layer 210 may be an IMD layer depicted as IMDx'. At least one first trench 212 may be etched in the oxide layer 210, using any of various suitable processes, such as a single damascene photo/etch process, to open the first trench(es) 212 in the oxide layer 210. A conductive pillar 214 (e.g., a via labeled "Vx'") may be deposited in each of the first trench(es) 212, such as a deposition of a barrier metal with a copper (Cu) plating. Chemical-mechanical polishing (CMP) may be performed on the surface of the oxide layer 210 to form a uniform planar surface. A second diffusion barrier layer 216 (e.g., SiN or SiCN) may be formed above the oxide layer 210. The second diffusion barrier layer 216 may correspond to the first diffusion barrier layer described herein with respect to the operations 100 of FIG. 1.

Figure 2C:
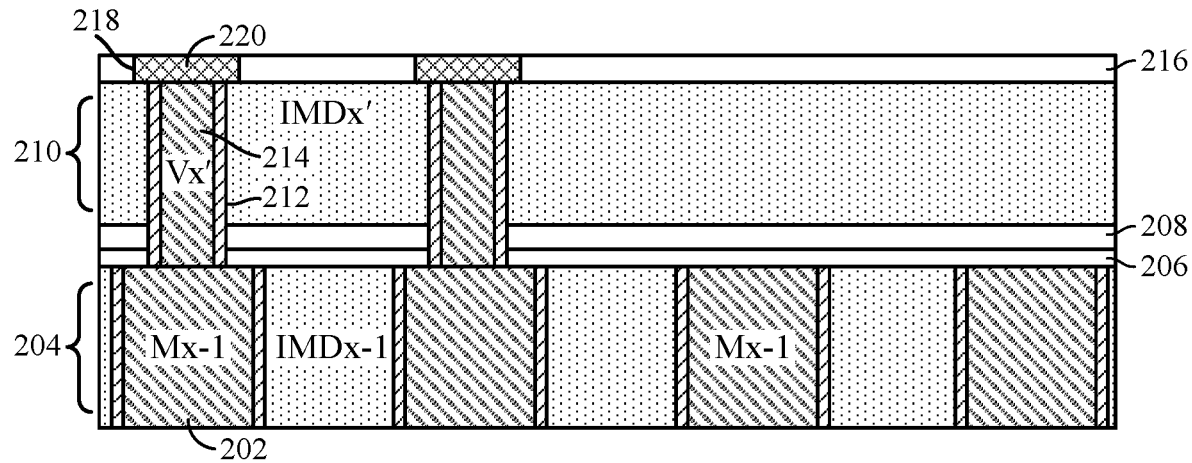
FIG. 2C illustrates a cross-sectional view of the example dielectric layer with a first electrode deposited above a conductive pillar in the oxide layer, in accordance with certain aspects of the present disclosure.

As shown in FIG. 2C, a second trench 218 is formed in the second diffusion barrier layer 216 in an area above the conductive pillar 214. The second trench 218 may be formed using a photolithography and etching process, for example. The second trench 218 may provide the pattern for a first electrode 220 and expose the conductive pillar 214. The first electrode 220 (also referred to as a "bottom electrode") is deposited in the second trench 218 such that the first electrode 220 is coupled to the conductive pillar 214, which may have a smaller profile than the first electrode 220. The first electrode 220 may provide an MTJ deposition pattern that sets a placement of the MTJ as further described herein. The first electrode 220 may be formed as a pattern having a larger profile (e.g., larger diameter) than the conductive pillar 214. In other words, material of the conductive pillar 214 need not be etched to form the undercut in the pillar 214 with respect to the first electrode 220 as shown in FIG. 2C. The first electrode 220 may include tantalum (Ta), tantalum nitride (TaN), or tungsten (W), for example. CMP may be performed on the surface of the first electrode 220 and the second diffusion barrier layer 216 to form a uniform planar surface.

Figure 2D:
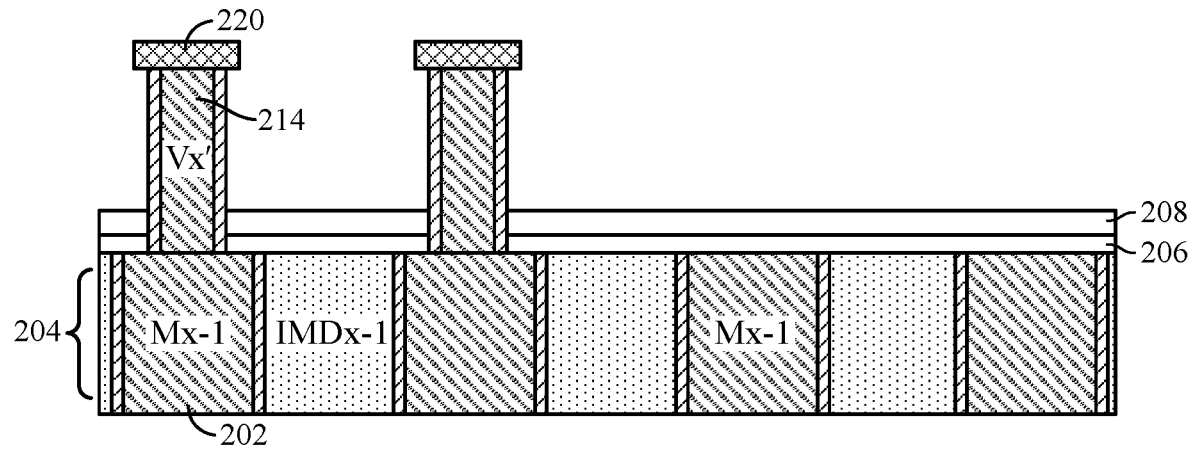
FIG. 2D illustrates a cross-sectional view of the example dielectric layer with the oxide layer removed, in accordance with certain aspects of the present disclosure.

Referring to FIG. 2D, the oxide layer 210 and the second diffusion barrier layer 216 of FIG. 2C may be removed. After removal, the first electrode 220, the conductive pillar 214, and the dummy layer 208 may be exposed in preparation for applying the MTJ film as further described herein. In other aspects, the dummy layer 208 may include a photoresist layer, an amorphous carbon layer, or another oxide layer as further described herein with respect to FIG. 2G.

Figure 2E:
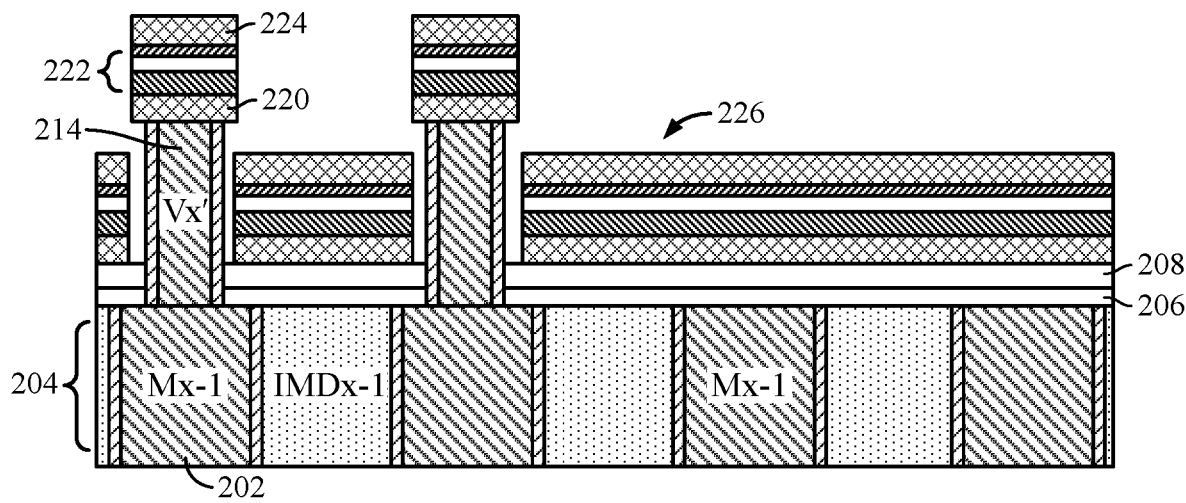
FIG. 2E illustrates a cross-sectional view of the example dielectric layer with an MTJ film deposited, in accordance with certain aspects of the present disclosure.

As illustrated in FIG. 2E, the MTJ 222 may be deposited above the first electrode 220 according to a shape of the first electrode 220. For instance, depositing the MTJ 222 may include depositing an MTJ film 226, comprising layers of the MTJ (e.g., a fixed layer, a spacer layer (e.g., magnesium oxide (MgO)), and a free layer), above the first electrode 220 and dummy layer 208. The fixed layer(s) may include one or more layers of various suitable materials, such as platinum (Pt), ruthenium (Ru), chromium (Cr), a cobalt platinum alloy (Co/Pt), cobalt (Co), iridium (Ir), tungsten carbide (e.g., WCFB), and/or a cobalt iron alloy (CoFe). The free layer(s) may include one or more layers of various suitable materials, such as a cobalt iron boron alloy (CoFeB), a magnesium tantalum alloy (Mg/Ta), and/or magnesium oxide (MgO). The smaller profile of the conductive pillar 214 relative to the first electrode 220 enables a shadow effect, when applying the MTJ 222 above the first electrode 220, allowing any extra MTJ film 226 to fall on the dummy layer 208. The shadow effect may also prevent the MTJ film 226 from contacting the conductive pillar 214 or reduce the amount of MTJ film 226 that contacts the conductive pillar 214. A second electrode 224 (also referred to as a "top electrode") may also be deposited above the MTJ 222. The second electrode 224 may include a conductive material comprising tantalum (Ta), ruthenium (Ru), tungsten (W), or tantalum nitride (TaN), for example.

Figure 2F:
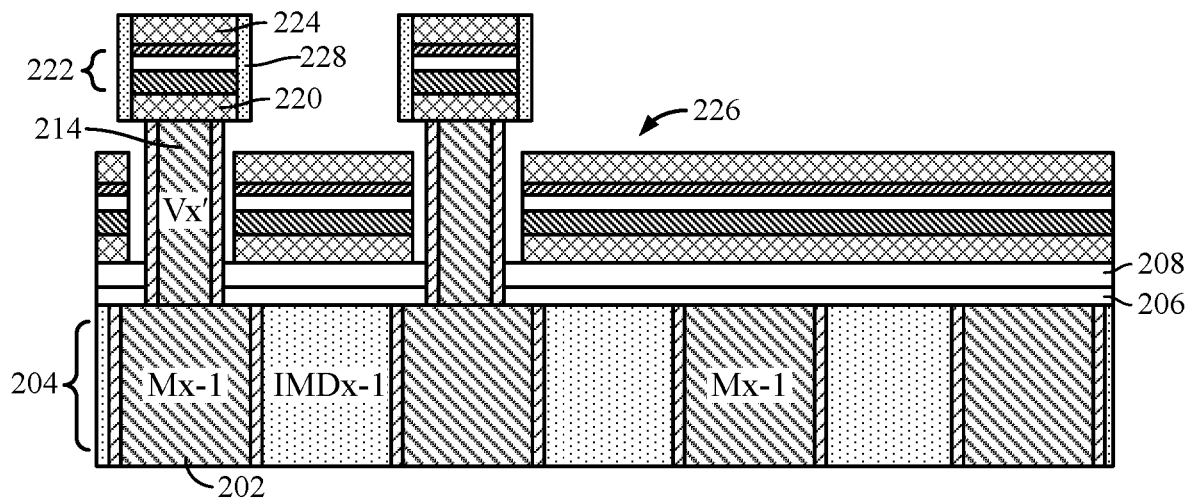
FIG. 2F illustrates a cross-sectional view of the example dielectric layer with a protective sidewall layer formed on the MTJ stack, in accordance with certain aspects of the present disclosure.

Referring to FIG. 2F, a sidewall protective layer 228 may be formed adjacent to the MTJ stack comprising the first electrode 220, MTJ 222, and second electrode 224. The height of the MTJ stack comprising the first electrode, the MTJ, and the second electrode may be less than or equal to 40 nm. The sidewall protective layer 228 may serve to protect the MTJ stack from being damaged while removing any excess MTJ film 226 on the dummy layer 208. The sidewall protective layer 228 may include an insulating material comprising silicon nitride ($Si_xN_y$) or aluminum oxide ($Al_2O_3$).

Figure 2G:
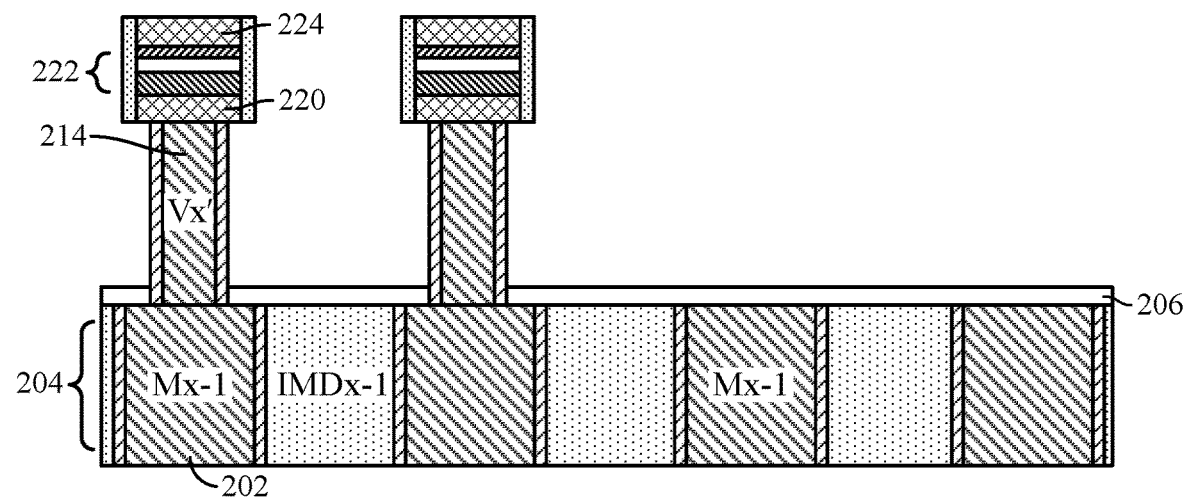
FIG. 2G illustrates a cross-sectional view of the example dielectric layer with an additional oxide layer formed, in accordance with certain aspects of the present disclosure.

As depicted in FIG. 2G, portions of the MTJ film 226 deposited above the dummy layer 208 and disposed between the conductive pillars 214 are removed without a post-deposition etching of the MTJ film 226 (such as an etching to form the profile of the MTJ stack). In certain aspects, the portions of the MTJ film 226 may be removed by stripping the dummy layer 208 (e.g., a photoresist layer or an amorphous carbon layer) using a plasma ashing process and lifting the portions of the MTJ film 226 away from the first layer 204. In other aspects, the portions of the MTJ film 226 may be removed by wet etching the dummy layer 208 (e.g., an oxide layer) disposed above the first diffusion barrier layer 206 and lifting the MTJ film 226 from the first layer 204.

Figure 2H:
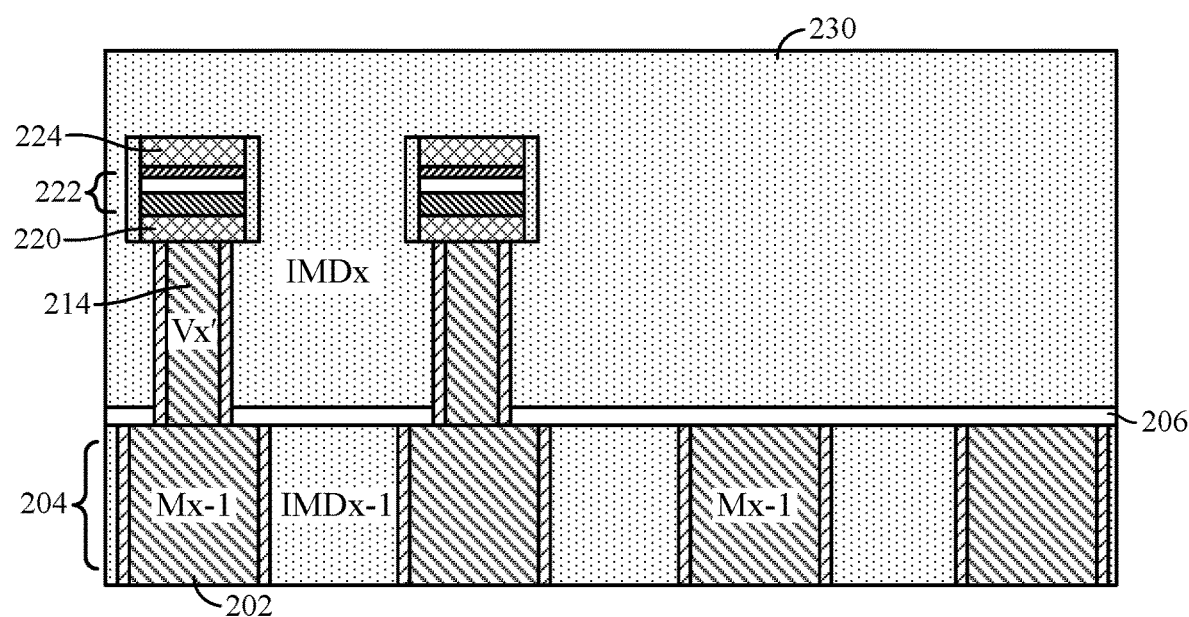
FIG. 2H illustrates a cross-sectional view of the example dielectric layer, in accordance with certain aspects of the present disclosure.

Referring to FIG. 2H, an additional oxide layer 230 (IMDx) may be deposited around the conductive pillar 214, first electrode 220, MTJ 222, and second electrode 224. The additional oxide layer 230 may provide structural support for the conductive pillar 214 and the MTJ stack. CMP may be performed on the surface of the additional oxide layer 230 to form a uniform planar surface.

Figure 2I:
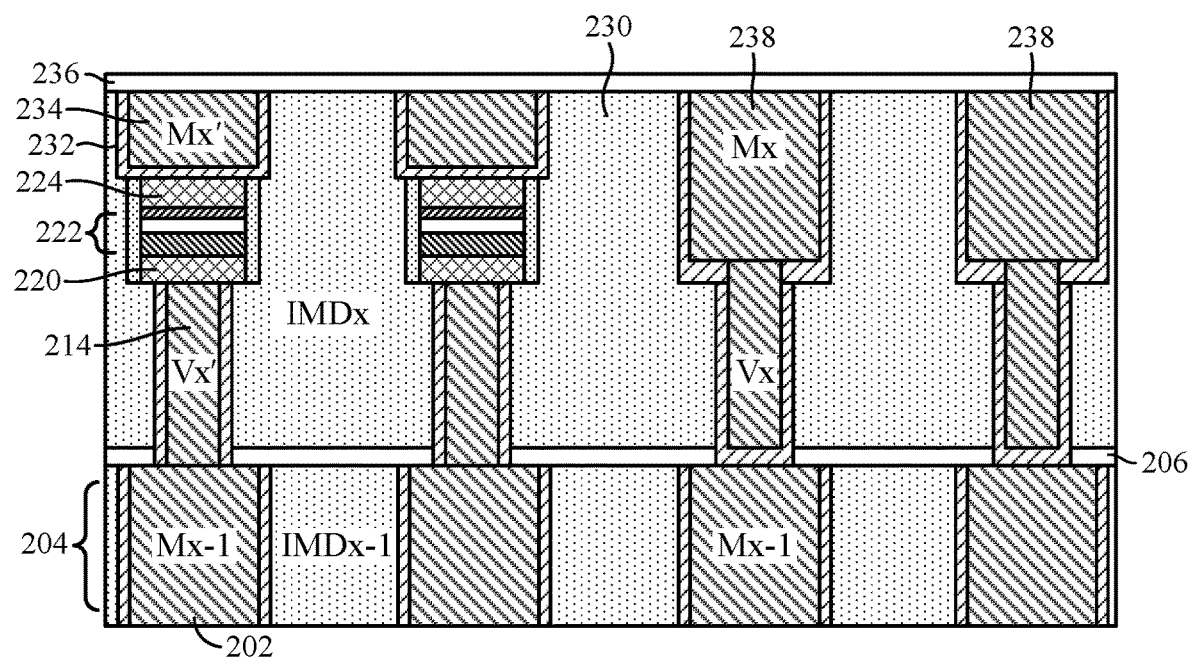
FIG. 2I illustrates a cross-sectional view of the example dielectric layer with a conductive material deposited in a trench formed above the MTJ stack, in accordance with certain aspects of the present disclosure.

As shown in FIG. 2I, a third trench 232 may be formed in the additional oxide layer 230. A conductive material 234 (labeled "Mx") may be deposited in the third trench 232 such that the conductive material 234 is coupled to the second electrode 224. A third diffusion barrier layer 236 may be deposited above the additional oxide layer 230 and the conductive material 234 in the third trench 232. Conductive traces 238 may also be formed in the additional oxide layer 230 adjacent to the conductive pillars 214 and MTJ stacks. The conductive traces 238 may provide electrical coupling between the MTJ array and other electrical components (such as capacitors, resistors, transistors, etc.). In certain aspects, the conductive traces 238 may represent other electrical components (such as transistors, resistors, capacitors, etc.) integrated in the IC along the same layer as the MTJ array.

The techniques for fabricating an integrated circuit described herein provide various improvements. In certain aspects, the bottom electrode pattern may define the MTJ pattern without an expensive MTJ photolithography and etching process. In other aspects, the fabrication process described herein may enable an MTJ stack thickness less than or equal to 40 nm, a pitch less than 50 nm between the MTJ and other MTJs in the integrated circuit, and a diameter of the MTJ less than or equal to 35 nm (or scaling factor of F=1.5). In general, the example method enables improved miniaturization of MTJs, increasing the density of the MTJ array. Furthermore, the shorter MTJ stack disclosed herein may easily fit within a metal layer or via height. The fabrication process described herein may also enable compatible integration with other electrical devices formed in the IC during the back-end-of-line (BEOL) process of the IC fabrication.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of fabricating an integrated circuit, comprising:
    forming a dummy layer above a dielectric layer, the dielectric layer having a conductive trace therein;
    forming an oxide layer above the dummy layer, the oxide layer having a conductive pillar therein;
    depositing a first diffusion barrier layer above the oxide layer, wherein the conductive trace is coupled to the conductive pillar;
    forming a first trench in the first diffusion barrier layer, the first trench being above the conductive pillar;
    depositing a first electrode in the first trench such that the first electrode is coupled to the conductive pillar and arranged above the dummy layer;
    removing the oxide layer and the first diffusion barrier layer to expose the conductive pillar and the first electrode; and
    depositing a magnetic tunnel junction (MTJ) above the first electrode according to a shape of the first electrode, wherein depositing the MTJ comprises:
        depositing a film, comprising layers of the MTJ, above the first electrode and the dummy layer; and
        removing at least a portion of the film deposited above the dummy layer.

2. The method of claim 1, further comprising depositing a second diffusion barrier layer above the dielectric layer, the second diffusion barrier layer being under the dummy layer, wherein forming the oxide layer above the dummy layer comprises:
    etching a second trench in the oxide layer; and
    depositing the conductive pillar in the second trench.

3. The method of claim 2, wherein depositing the MTJ comprises:
    depositing a portion of the film on the first electrode;
    depositing, by a shadow effect resulting from the first electrode being positioned higher than the dummy layer, another portion of the film above the dummy layer; and
    removing the other portion of the film deposited above the dummy layer without a post-deposition etching of the film.

4. The method of claim 3, wherein the dummy layer comprises amorphous carbon.

5. The method of claim 3, wherein removing the other portion of the film deposited above the dummy layer comprises:
    stripping the dummy layer using a plasma ashing process; and
    lifting the other portion of the film away from the dielectric layer.

6. The method of claim 1, further comprising depositing a second electrode above the MTJ.

7. The method of claim 6, further comprising forming a sidewall adjacent to a stack comprising the first electrode, the MTJ, and the second electrode.

8. The method of claim 6, further comprising depositing an additional oxide layer around the conductive pillar, the first electrode, the MTJ, and the second electrode.

9. The method of claim 8, further comprising:
    forming a second trench in the additional oxide layer;
    depositing a conductive material in the second trench such that the conductive material is coupled to the second electrode; and
    depositing a second diffusion barrier layer above the additional oxide layer and above the conductive material.

10. The method of claim 6, wherein a height of a stack comprising the first electrode, the MTJ, and the second electrode is less than or equal to 40 nm.

11. The method of claim 1, wherein forming the first trench comprises etching the first trench in the first diffusion barrier layer.

12. The method of claim 1, wherein a pitch between the MTJ and other MTJs in the integrated circuit is less than 50 nm.

13. The method of claim 1, wherein a diameter of the MTJ is less than or equal to 35 nm.

14. The method of claim 1, wherein the first electrode provides an MTJ deposition pattern that sets a placement of the MTJ.

15. The method of claim 1, wherein the conductive pillar has a profile smaller than a profile of the first electrode.

16. The method of claim 1, wherein the integrated circuit is a memory device.

17. The method of claim 16, wherein the memory device is a magnetoresistive random access memory.

18. The method of claim 1, wherein depositing the first electrode comprises depositing the first electrode in the first trench such that the first electrode is coupled to the conductive pillar and is disposed at a higher level than the dummy layer.

* * * * *